(12) United States Patent
Yao

(10) Patent No.: US 6,661,941 B1
(45) Date of Patent: Dec. 9, 2003

(54) FREQUENCY LOCKING OF TUNABLE LASERS BY USING A BIREFRINGENT OPTICAL CAVITY

(76) Inventor: Xiaotian Steve Yao, 23324 Ridge Line Rd., Diamond Bar, CA (US) 91765

( * ) Notice: Subject to any disclaimer, the term of this patent is extended or adjusted under 35 U.S.C. 154(b) by 182 days.

(21) Appl. No.: 10/056,215

(22) Filed: Jan. 23, 2002

Related U.S. Application Data

(60) Provisional application No. 60/263,843, filed on Jan. 23, 2001.

(51) Int. Cl.[7] ............................... G02B 6/27; H01S 3/13
(52) U.S. Cl. ............................ 385/15; 372/32; 372/20; 372/105; 385/11
(58) Field of Search ................. 385/11, 15, 27, 385/31; 372/6, 20, 29.011, 29.02, 32, 92, 98, 99, 103, 105, 106

(56) References Cited

U.S. PATENT DOCUMENTS

| | | | | |
|---|---|---|---|---|
| 3,549,236 A | * | 12/1970 | Mink | 359/247 |
| 4,791,633 A | * | 12/1988 | Esherick et al. | 372/32 |
| 5,107,512 A | * | 4/1992 | Shibutani | 372/32 |
| 6,483,956 B1 | * | 11/2002 | Shevy et al. | 385/11 |
| 6,611,342 B2 | * | 8/2003 | Patel et al. | 356/519 |

* cited by examiner

Primary Examiner—John D. Lee
Assistant Examiner—Sarah N Song
(74) Attorney, Agent, or Firm—Fish & Richardson P.C.

(57) ABSTRACT

Techniques and systems for monitoring a difference between the frequency of a laser and a resonance of a birefringent optical resonator. A feedback control loop may be used to lock the laser to the resonator, or alternatively, to lock the optical resonator to the laser.

23 Claims, 3 Drawing Sheets

FREQUENCY LOCKING OF TUNABLE LASERS BY USING A BIREFRINGENT OPTICAL CAVITY

This application claims the benefit of U.S. Provisional Application No. 60/263,843 by Yao and filed Jan. 23, 2001, the entirety of which is incorporated herein by reference as part of this application.

TECHNICAL FIELD

This application relates to frequency locking of tunable lasers, and more specifically, to techniques for stabilizing the output frequency of a laser by using an optical cavity to provide a frequency error signal and techniques for monitoring a frequency drift between a laser and an optical cavity.

BACKGROUND

Certain lasers are tunable in frequency to produce a variable output laser frequency in response to a change in one or more laser parameters. For example, the cavity length of a laser may be adjusted to change the output laser frequency. In semiconductor diode lasers, the driving current may be adjusted to tune the output laser frequency.

A control mechanism for adjusting the output laser frequency in a tunable laser may be used to not only tune a laser but also lock a laser at a specified laser frequency. Some laser locking systems use a laser frequency monitoring mechanism to monitor the drift of the output laser frequency with respect to a frequency reference. When the output laser frequency deviates from the specified laser frequency beyond a specified tolerance range, the control mechanism adjusts one or more laser parameters to reduce the frequency deviation and hence locks the laser.

SUMMARY

This application describes techniques and systems for monitoring a difference between the frequency of a laser and a resonance of a birefringent optical resonator. A feedback control loop may be used to lock the laser to the resonator, or alternatively, to lock the optical resonator to the laser.

In one embodiment, a laser frequency monitoring system includes an optical resonator having a birefringent medium located inside the resonator. The resonator is positioned to receive a laser beam produced by the laser to reflect a portion of the laser beam as a reflected optical signal and oriented so that said linear polarization of the laser beam is not parallel to either of two principal polarization axes of said birefringent medium. The system also includes an optical element located in an optical path of at least a portion of the reflected optical signal to produce a phase shift of about 90 degrees between polarizations respectively along the two principal polarization axes. An optical polarizer is located in an optical path of at least a portion of a transmitted signal from the optical element to mix two orthogonal polarizations to produce a mixed optical signal. In addition, the system has an optical detector positioned to receive the mixed optical signal to produce a detector signal which has an AC component indicating a frequency change in the laser frequency.

A laser control unit may be coupled to control a laser parameter of the laser according to the AC component to reduce the change in the laser frequency.

Alternatively, the birefringent cavity may be engaged to a tuning element which operates to change an optical path length of the cavity in response to a control signal. The AC component may then be used to tune the cavity to reduce the frequency difference from the laser.

DETAILED DESCRIPTION

The present disclosure includes techniques that lock a tunable laser at a desired laser frequency by using a Fabry-Perot resonator that encloses a birefringent medium configured to exhibit different refractive indices along two orthogonal principal axes of polarization. When a light beam is at a frequency in resonance with the Fabry-Perot resonator, it transmits through the resonator. The light beam is essentially totally reflected when the frequency of the light beam deviates from the frequency in resonance with the Fabry-Perot resonator beyond the linewidth of the resonance peak of the resonator. Therefore, the Fabry-Perot resonator can be configured to be resonant with a light beam at the desired laser frequency and polarized along one principal axis of polarization of the birefringent medium while a light beam at the same desired laser frequency but polarized along another principal axis of the birefringent medium is not in resonance and is completely reflected.

The above birefringent Fabry-Perot resonator is used as part of the laser frequency monitoring mechanism to monitor the drift of the laser frequency. In operation, when the output laser frequency of the tunable laser deviates from the desired laser frequency, a portion of the light beam in resonance with the resonator is reflected along with the other totally-reflected light beam in a different polarization. This part of the reflected beam will experience an additional phase shift associated with the frequency deviation. This additional phase shift can be used to generate an error signal to represent the amount and direction of the frequency deviation of the actual laser frequency with respect to the desired laser frequency. This error signal is then used to control and to adjust the tunable laser to reduce the frequency deviation.

Figure 1:
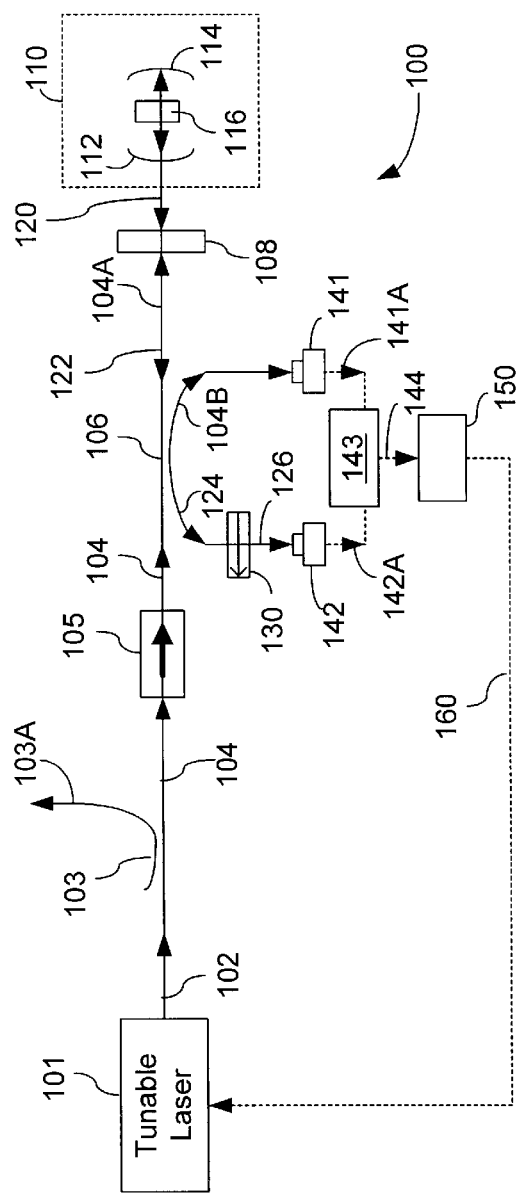
FIG. 1 shows one embodiment of a laser frequency locking system based on a birefringent Fabry-Perot resonator, where solid lines with arrows represent optical beams and dashed lines with arrows represent electrical signals.

FIG. 1 shows a laser frequency locking system 100 based on a birefringent Fabry-Perot resonator 110 for a tunable laser 101 according to one embodiment. The tunable laser 101 may be any laser that is tunable to produce a linearly-polarized laser beam 102 with a varying output laser frequency in response to an external control signal, such as diode lasers, distributed feedback lasers, fiber lasers and others. An optical coupler 103, such as a fiber optical coupler used in a fiber system, may be used to produce an output laser 103A and to split a fraction of the laser beam 102 as a monitor laser beam 104 for monitoring and controlling the frequency of the laser beam 102. An optical isolator 105 may be optionally used to prevent any optical feedback caused by the optical reflection from the Fabry-Perot resonator 110.

An optical coupler 106 may be placed in the optical path of the monitor laser beam 104 to perform two different optical coupling operations. First, the coupler 106 splits a portion of the monitor beam 104 as a first optical signal 104B and directs the signal 104B to a first optical detector 142 which produces a first detector signal 141A. The remaining portion 104B of the monitor beam 104 transmits through the optical coupler 106 to reach the Fabry-Perot resonator 110. Secondly, the coupler 106 splits a portion of a reflected beam 122 from the Fabry-Perot resonator 110 that opposes the monitor beam 104 as a second optical signal 124. The signal 124 is directed through an optical polarizer 130 to produce a new optical beam 126. A second optical detector 142 is used to receive the optical beam 126 to produce a second detector signal 142A.

As described below, the polarization of the input monitor beam 104A and the polarization of the second optical signal 124 are controlled so that the second detector signal 142A includes a DC component and an AC component. The DC component does not vary with a phase shift or jitter in the reflected beam 122 caused by a frequency drift or jitter in the laser frequency of the laser beam 102. The AC component, however, varies with the phase drift and hence may be used to represent an error in the laser frequency of the laser beam 102 from the desired laser frequency. The relative strength of the amplitudes of the first and second detector signals 141A and 142A may be adjusted so that the first detector signal 141 can be used to substantially cancel out the DC portion of the first detector signal 142A to produce an error signal 144 that mainly comprises the AC component of the second detector signal 142A. This may be achieved by adjusting the gains of the detectors 141 and 142, or alternatively, by using optical attenuators to adjust the signal strengths of the beams 104B and 126 that enter the detectors 141 and 142. A signal subtracting circuit 143 may be used as an error signal generator to receive and subtract signals 141A and 142A to produce the error signal 144.

The Fabry-Perot resonator 110 may be formed of two optical reflectors 112 and 114. At least one of the reflectors 112 and 114 may be planar or curved reflectors (e.g., spherical). In general, an input beam reflects between the two reflectors 112 and 114 multiple times before being reflected or transmitted by the resonator 110. It is well known that the transmission of such resonator includes evenly spaced resonance peaks as a function of the phase of the light caused by propagating from one reflector to another or as a function of the frequency of the input light beam. A transmission resonance peak occurs when the phase change by one round-trip in the resonator is 360 degrees or a multiplicity of 360 degrees. The spacing in frequency between two adjacent resonance peaks, either in reflectivity or transmission spectrum, is the free spectral range (FSR) and is mainly determined by the optical path length between the reflectors 112 and 114, i.e., the product of the refractive index and the physical length. As an example, a planar resonator, with both reflectors being planar and filled with a medium with a refractive index (n), has a resonance condition if $2\,nL=m\lambda$, where L is the resonator spacing, m is an integer representing the order of the resonance peaks, and $\lambda$ is the wavelength of the input light in vacuum. The free spectral range or mode spacing is $c/(2\,nL)$. The line width of the transmission resonance peaks is primarily determined by the reflectivities and optical alignment of the reflectors 112 and 114. Narrow resonance peaks can be achieved by using highly reflective reflectors 112 and 114 and by properly aligning the reflectors 112 and 114 with respect to each other.

The Fabry-Perot resonator 110 is a birefringent resonator by including a birefringent optical medium 106 to occupy a portion of or the entirety of the optical path between the reflectors 112 and 114. For example, a birefringent crystal may be used as the medium 106. As another example, the resonator 110 may be entirely formed from a birefringent optical fiber by implementing two reflectors at two different locations in the fiber. The birefringence in the fiber may be achieved by using a birefringent material in the fiber core. Alternatively, the birefringence in the fiber may be achieved by applying pressure perpendicular to the fiber or by bending the fiber. A reflector in the fiber may be formed by a fiber grating or by a reflective coating at an end facet of the fiber. In implementation, the optic axis of the resonator 110 may be substantially perpendicular to the two principal axes of the birefringent material.

Since the resonator 110 exhibits different refractive indices along two orthogonal principal axes of polarization, two sets of transmission resonance peaks are produced with one set of repetitive peaks for light polarized along one principal polarization and another set of repetitive peaks for light polarized along the other, orthogonal principal polarization. In the example of the planar resonator, for the same order of m, two resonance peaks can be produced at two different wavelengths $\lambda_f$ and $\lambda_s$ for light beams polarized along the fast and slow axes, respectively: $2\,n_fL=m\lambda_f$ and $2\,n_sL=m\lambda_s$, where the refractive index $n_f$ along the fast axis is less than the refractive index $n_s$ long the slow axis.

Figure 2:
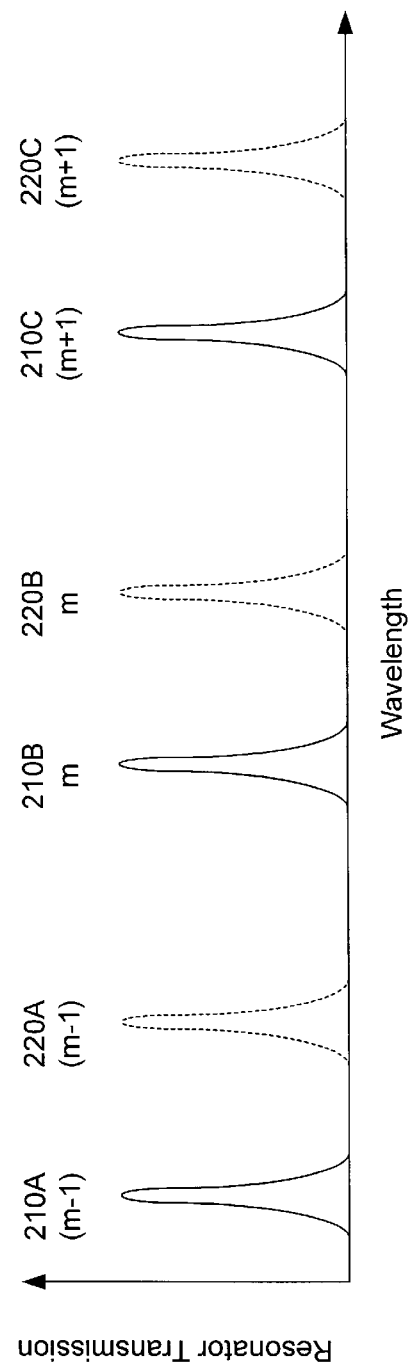
FIG. 2 shows spectrum of the transmission of the birefringent resonator used in the system shown in FIG. 1. The spectrum of the reflectivity is complementary to the spectrum of the transmission.

FIG. 2 shows the spectra of the transmission of the resonator for both light polarizations along both the fast and slow axes. The transmission peaks 210A, 210B, 210C with a spacing of $c/(2\,n_fL)$ represent peaks for light polarized along the fast axis for orders of (m−1), m, and (m+1), respectively. The transmission peaks 220A, 220B, 220C with a spacing of $c/(2\,n_sL)$ represent peaks for light polarized along the slow axis for orders of (m−1), m, and (m+1), respectively. At the mth order, the frequency difference between the resonance peaks for light polarizations along the fast and slow axes is $(n_s-n_f)mc/(2\,n_sn_fL)$ Notably, the birefringent resonator 110 may be designed to separate a transmission peak for one principal polarization from an adjacent transmission peak in wavelength for another principal polarization so that, when the wavelength of the laser 101 is tuned to a wavelength within a transmission peak for a first principal polarization, the transmission for another, second principal polarization is and remains at zero. That is, when the frequency of the laser 101 changes from the center of a particular transmission peak to another position within the same transmission peak to change the transmission of the first principal polarization from the maximum transmission to another reduced transmission value, the second principal polarization at the same wavelength remains totally reflected by the resonator 110. For example, In FIG. 2, the frequency separations between adjacent peaks 220A, 210B, and 220B are sufficiently large to satisfy the above desirable condition. This condition may be achieved by selecting a medium 106 with a sufficiently large $(n_s-n_f)$ or decreasing the resonator length L, or by using a combination of both.

Figure 3A:
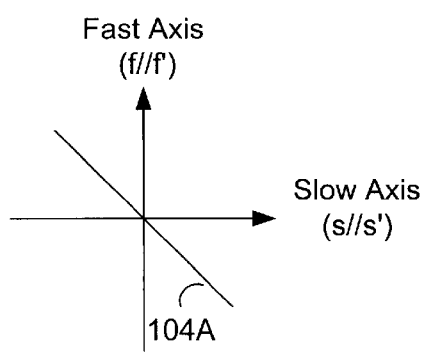
FIGS. 3A and 3B show two possible arrangements of the direction of the input polarization with respect the principal fast and slow axes of the birefringent resonator in FIG. 1.
Figure 3B:
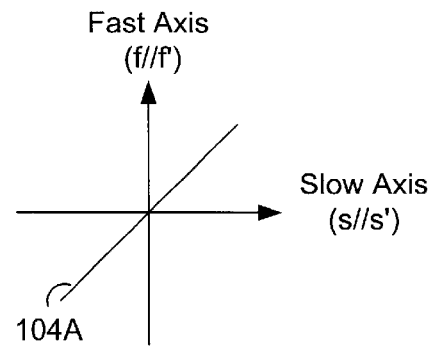

In addition, the linear polarization of the input monitor beam 104A and the principal axes of the birefringent resonator 110 should form an angle of about 45 degrees for the system 100 to operate properly. FIGS. 3A and 3B illustrate two possible polarization arrangements under this condition. Notably, the angle may be set at values other than 45 degrees. In particular, the angle may be adjusted to balance the power levels of the signals 141A and 142A produced by the detectors 141 and 142, respectively, to enhance the AC component in the signal 144 and to suppress the DC component. Under this angled arrangement in polraization, the resonator 110 receives the beam 104A in polarizations along both fast and low axes. For example, assume the resonator 110 is configured to be resonant with the light at the desired laser frequency for a polarization along the fast axis. Under this assumed condition, when the laser 101 operates at the desired laser frequency, the polarization along the fast axis completely transmits through the resonator 110 while the polarization along the slow axis is completely reflected. Hence, the reflected beam 122 includes only the polarization along the slow axis. When the actual frequency of the laser 101 deviates from the desired laser frequency caused by some internal processes (e.g., thermal noise and other fluctuations) or environmental factors (e.g., a change in temperature or vibrations), the transmission of the polarization along the fast axis is reduced so that a portion of the polarization along the fast axis is reflected. Note that the polarization along the slow axis remains totally reflected. Hence, the reflected beam 122 includes polarizations along both fast and slow axes of the birefringent resonator 101.

Another aspect of the frequency locking techniques of the present disclosure is to provide a polarization control mechanism to produce a phase shift of 90 degrees between the reflected polarizations along the fast and slow axes. One way to implement this polarization control is to place a quarter-wave plate 108 in the optical path between the optical coupler 106 and the Fabry-Perot resonator 110 as shown in the system 100 in FIG. 1. The fast and slow axes of the quarter-wave plate 108 are respectively aligned with the fast and slow axes of the birefringent resonator 110. Hence, the linear polarization of the input monitor beam 104A can also have two arrangements as illustrated in FIGS. 3A and 3B. In operation, the beam 104A transmits through the quarter-wave plate 108 upon entering the resonator 104A. This introduces a phase shift of 45 degrees between the fast and slow polarizations. When the laser deviates from the desired frequency, the reflected beam 120 includes both fast and slow polarizations with a phase shift of 45 degrees. The reflected beam 120 passes through the quarter-wave plate 108 to become the reflected beam 122 to add another phase shift of 45 degrees between the fast and slow polarizations so that the total phase shift between the fast and slow polarizations is 90 degrees in the beam 122.

Figure 4:
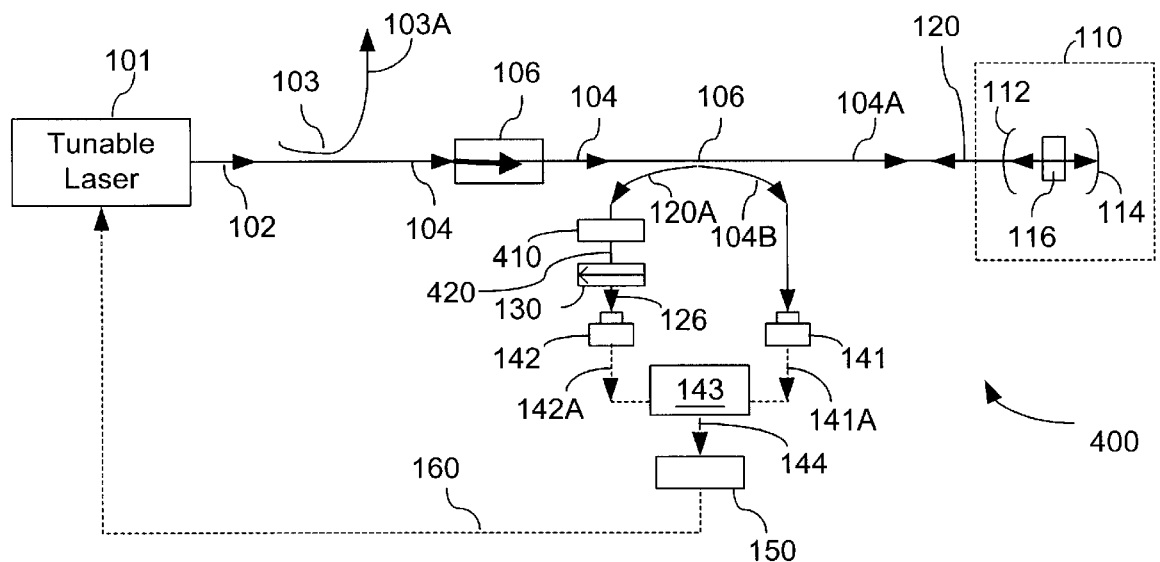
FIG. 4 shows another embodiment of a laser frequency locking system based on a birefringent Fabry-Perot resonator.

Alternatively, FIG. 4 shows another system 400 where the quarter-wave plate 108 is replaced by a half-wave plate 410 in the optical path of the beam 120A between the coupler 106 and the polarizer 130 in this case, the polarization of the monitoring beam 104A generally is not parallel to either of the fast and slow axes of the birefringent resonator 110. For example, the angle between the polarization of the beam 104A and one of the fast and slow polarization axes of the resonator 110 may be about 45 degrees. The half-wave plate 108 is oriented to have one of its principal axes of polarization align with one of the principal axes of polarization of the birefringent resonator 110. The coupler 106 splits a portion of the reflected beam 120 to produce a beam 120A. The half-wave plate 410 modifies the beam 120A to introduce a 90-degree phase shift between the two polarizations to produce the beam 420.

Both systems shown, in FIGS. 1 and 4 use the polarizer 130 to mix the fast and slow polarizations in the reflected beam to produce a polarization-mixed beam 126. The polarizer 130 is purposely aligned at an angle with respect to either of the fast and slow principal axes of the resonator 110, e.g., an angle θ with respect to the fast axis. Therefore, after passing through the polarizer, the orthogonal polarizations along the fast and slow principal axes are mixed to produce the optical signal 126 that is linearly polarized along the direction of the polarizer 130. The combination of the 90-degree phase shift between the fast and slow polarizations in the reflected beam (122 or 420) and the polarization mixing by the polarizer 130 produces the AC component in the second detector output 142A that represents the frequency deviation in the laser 101.

The following describes details of generation of the error signal 144. The assumptions used here are intended for illustration only and should not be construed as limitations.

It is assumed in the following analysis that the polarization along the slow principal axis, i.e., the s polarization, is not resonant with the Fabry-Perot resonator 110 at or near the desired laser frequency and hence is completely reflected by the resonator 110 within the spectral range in which the laser frequency of the laser 101 fluctuates. Hence, the reflected s polarization before the polarizer 130 may be expressed as $$\vec{E}_s = E_1 e^{i\frac{\pi}{2}+i\varphi_0}\hat{s}, \quad (1)$$

where $E_1$ is the amplitude of the electric field for the s polarization, $\phi_o$ is a constant phase shift, and s represents the unity vector along the slow axis. The additional phase shift of $\pi/2$ (i.e., 90 degrees) in Eq.(1) is introduced by using either the quarter-wave plate 108 in the system 100 of FIG. 1 or the half-wave plate 410 in the system 100 of FIG. 4.

The other polarization along the fast principal axis, i.e., the f polarization, is assumed to be resonant with the Fabry-Perot resonator 110 and to completely transmit through the resonator 110 without reflection when the laser frequency of the laser 101 is at the desired laser frequency. In the spectrum shown in FIG. 2, the desired laser frequency is at the center of one of the transmission peaks for the f polarization, e.g., the transmission peak 210B. When the laser frequency deviates from the desired laser frequency, the laser frequency then shifts its spectral position away from the center of the transmission peak 210B by Δω in terms of the angular frequency ω so that the f polarization is no longer completely transmitted. Instead, if the drifted laser frequency still falls within the transmission peak 210B, a portion of the f polarization is transmitted and the remaining portion of the f polarization is reflected. This reflected portion of the f polarization can be written as $$\vec{E}_f = \Delta E_2 e^{i\delta(\Delta\omega)+i\phi_o}\hat{f} \quad (2)$$

where $\Delta E_2$ represents the amplitude of the electric field of the reflected f polarization, $\delta(\Delta\omega)$ rep resents a phase shift in the reflected f polarization that is associated with the frequency deviation $\Delta\omega$, and f is the unity vector along the fast axis.

Hence, the total optical signal incident to the polarizer 130 is a sum of the reflected s polarization in Eq. (1) and the reflected f polarization in Eq. (2). The polarizer 130, which is oriented to have an angle θ with respect to the f polarization, mixes the reflected s polarization and the reflected f polarization to produce the following mixed optical signal as the signal 126:

$$E_P = E_1 e^{i\frac{\pi}{2}+i\varphi_0}\sin\theta + \Delta E_2 \cos\theta e^{i\delta(\Delta\omega)+i\varphi_0} \qquad (3)$$

The power of the signal 126, $P_2$, received by the second optical detector 142 can be approximately expressed in the following form:

$$\begin{aligned}P_2 \propto |E_P|^2 &= E_1^2\sin^2\theta + \Delta E_2^2\theta + 2E_1\Delta E_2\sin\theta\cos\theta\sin\delta(\Delta\omega) \qquad (4)\\ &= E_1^2\sin^2\theta + \Delta E_2^2\cos^2\theta + E_1\Delta E_2\sin 2\theta\sin\delta(\Delta\omega)\end{aligned}$$

where the first two terms are independent with the phase shift $\delta(\Delta\omega)$ caused by the frequency fluctuation of the laser 101 and the third term represents a power variation caused by the laser frequency fluctuation. In this context, the first two terms are DC components and the third term is the AC component. This separation of DC and AC components is based on the 90-degree phase shift between the reflected f and s polarizations at the input the polarizer 130. Note that, the DC components may vary with the fluctuation in the output power of the laser 101.

The signal 104B is representative of the output signal 104 or 102 from the laser 101 and hence, like the DC terms in the signal 126, does not vary with the phase shift $\delta(\Delta\omega)$. Therefore, the output detector signals 141A and 142A may be adjusted so that the total DC power level from the signal 142A is substantially equal to the total power level of the signal 141A. The two signals 141A and 142A can be subtracted by using the signal subtracting circuit 143 to produce the error signal 144 which includes only the AC term as a function of the phase shift $\delta(\Delta\omega)$:

$$\begin{aligned}\text{Error Signal} &= E_1\Delta E_2\sin(2\theta)\sin(\delta(\Delta\omega)) \qquad (5)\\ &\approx E_1\Delta E_2\sin 2\theta \cdot \delta(\Delta\omega)\end{aligned}$$

where the approximation applies when the phase shift $\delta(\Delta\omega)$ is small. Therefore, the error signal 144 can be used to represent both the magnitude and direction of the frequency deviation of the actual laser frequency from the desired laser frequency.

As shown in the systems 100 and 400 in FIGS. 1 and 4, respectively, a laser control unit 150, which generally includes control electronics, is used to receive the error signal 144 and is designed to produce a laser control signal 160 in response to the error signal 144. The laser control signal 160 is fed into the tunable laser 101 to adjust one or more laser parameters to reduce the frequency deviation $\Delta\omega$ of the laser 101 with respect to the desired laser frequency. This laser control unit 150 completes an active frequency control feedback loop in the systems 100 and 400. In absence of the control unit 150, the remaining part of the system in FIGS. 1 and 4 is a frequency monitoring system and can be operated to monitor the frequency change of the laser.

The above laser frequency monitoring and locking techniques and systems may be used in various applications. For example, wavelength-division-multiplexing (WDM) has been used to expand the capacity of a fiber communication link by simultaneously transmitting different optical waves at different wavelengths through a single fiber. It is desirable to specify and standardize the wavelengths in WDM signals so that WDM devices, modules, and subsystems from different manufacturers are compatible and can be integrated and deployed in commercial WDM networks. One commonly-used WDM wavelength standard is the International Telecommunication Union (ITU) standard, where the WDM wavelengths of different optical waves are required to match ITU grid frequencies. Hence, the laser transmitters for the different WDM wavelengths need be stabilized against wavelength instability caused by either internal or external fluctuations. The techniques and systems disclosed above provide solutions to such technical requirements.

When implementing the systems 100 and 400 in fiber systems or WDM fiber systems, the optical signals may be transmitted via fibers. Hence, the optical links between the laser 101 and the coupler 106, the coupler 106 and the resonator 110, the coupler 106 and the detectors 141 and 142 may be formed of optical fibers. In particular, polarization-maintaining-fibers may be used. The birefringent resonator 110 may also be formed in an optical fiber. Various optical couplers may also be fiber couplers.

The frequency monitoring systems and the associated lasers with a control feedback shown in FIGS. 1 and 4 may be implemented by using fibers or planar waveguides to form part or all optical paths between different optical components. In an all-fiber construction, fibers are used to direct the laser beams and the optical couplers 103 and 106 are fiber couplers. Alternatively, the laser beams may be directed from one optical component to another through free space and thus the optical couplers 103 and 106 may be beam splitters formed by a prism cube or a partial reflective optical surface that is titled with an angle with respect to the direction of the laser beam. For example, the coupler 106 may be a beam splitter to reflects a portion of the incoming beam 104 to one side as the beam 104B and to reflects a portion of the reflected beam 104A to the opposite side as the beam 124. Accordingly, the detectors 141 and 142 are placed on opposite sides of the beam splitter 106.

The above optical monitoring techniques allow for measuring and monitoring the frequency difference between the laser 101 and the resonance frequency of the birefringent cavity 110. In laser stabilization systems shown in FIGS. 1 and 4, the laser frequency is locked to the resonance o of the cavity 110. In such systems, the birefringent cavity 110 is generally stabilized to provide a frequency reference because the locked laser would drift with the reference frequency of the cavity 110 within the locking operating range.

Figure 5:
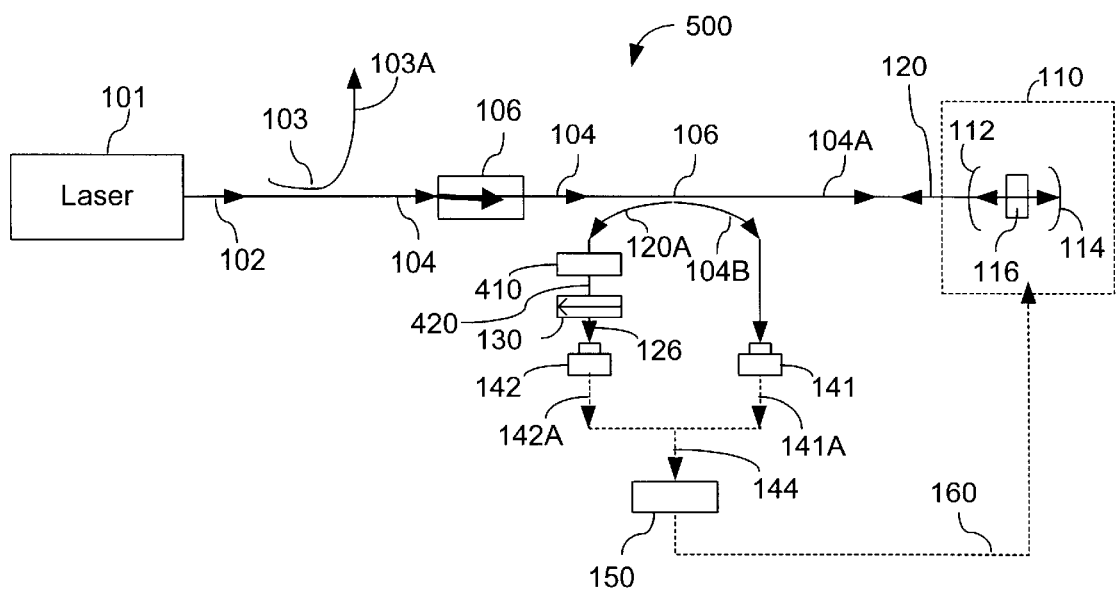
FIGS. 5 and 6 show exemplary systems that lock one or more birefringent Fabry-Perot resonators to a laser based on the frequency monitoring techniques shown in FIGS. 1 and 4.

Alternatively, the same monitoring systems may be used to lock the cavity 110 to the laser frequency of the laser 101, where the cavity 110 is a tunable cavity with a tuning element engaged the cavity 110 to adjust the optical path length. For example, the spacing between the two reflectors of the cavity may be adjusted, by, e.g., using a piezo electric element engaged to at least one of the reflectors. FIG. 5 shows one embodiment 500 of this system where the cavity 110 is a tunable cavity and the control unit 150 is coupled to the tunable cavity 110 to adjust the optical path length of the cavity 110 to reduce the frequency difference indicated by the signal 144. This scheme 500 may be used to broadcast a frequency reference of the laser 101 to multiple birefringent cavities.

Figure 6:
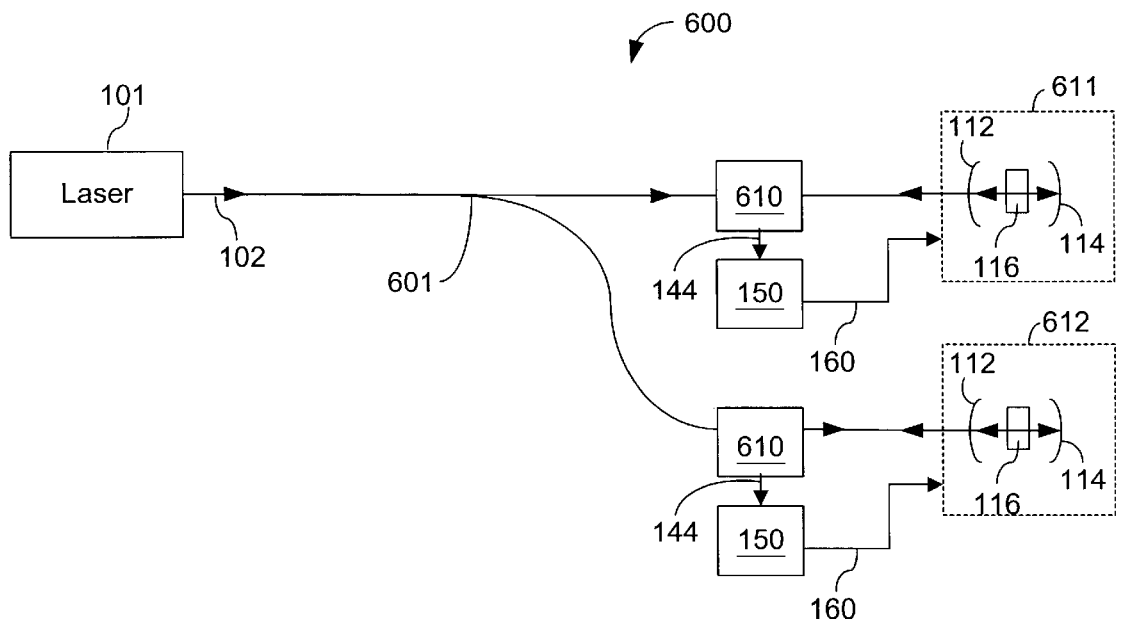

FIG. 6 shows one implementation 600 where two different birefringent cavities 611 and 612 are locked to the same laser 101. An optical coupler 601 is used to split the output laser beam 102 into two laser beams, one for locking the cavity 611 and another for locking the cavity 612. Optical fibers may be used to send the frequency reference to remote cavities 611 and 612 at the same or different locations. A frequency monitoring module 610 is used to produce the signal 144. As shown in FIGS. 1 and 4, the module 610 may be formed of the coupler 106, polarization element 108 or 410, the polarizer 130, the detectors 141 and 142, and the signal subtracting circuit 143. Since the cavities 611 and 612 are locked to the laser 101, two different lasers may be in turn locked to the cavities 611 and 612, respectively, by using either one of the laser locking systems shown in FIGS. 1 and 4 or any other laser locking schemes which use the cavities 611 and 612 to provide the locking reference frequencies.

although only a few embodiments are disclosed, it is understood that various modifications and enhancements may be made without departing from the following claims.

What is claimed is:

1. A system, comprising:
   a laser configured to produce a laser beam at a laser frequency with a linear polarization and tunable to vary said laser frequency in response to a laser control signal;
   an optical coupler positioned to receive a portion of said laser beam and operable to split said received portion into a monitor beam and a first optical signal;
   an optical Fabry-Perot resonator configured to include a birefringent medium which exhibits different refractive indices a long first and second orthogonal polarization axes, and positioned to reflect a portion of said monitor beam as second optical signal and oriented so that said linear polarization of said monitor beam is not parallel to either of said first and said second polarization axes of said birefringent medium, wherein said resonator is configured to substantially transmit a first light beam in said monitor beam that is polarized in said first polarization axis and at a desired laser frequency and to substantially reflect a second light beam in said monitor beam that is polarized in said second polarization and at said desired laser frequency;
   a polarization unit located in an optical path of at least a portion of said second optical signal from said resonator to produce a phase shift of about 90 degrees between polarizations along said first and said second polarization axes in said portion of said second optical signal;
   an optical polarizer having a polarization that is not parallel to either of said polarizations along said first and said second polarization axes in said second optical signal, positioned to receive at least part of said portion of said second optical signal to produce a third optical signal;
   a first optical detector positioned to receive said first optical signal to produce a first detector signal;
   a second optical detector positioned to receive said third optical signal to produce a second detector signal;
   a signal subtracting circuit coupled to said first and said second optical detectors to mix said first and said second detector signals to produce an error signal that indicates a deviation of said laser frequency from said desired laser frequency; and
   a laser control unit coupled to receive said error signal and operable to produce said laser control signal according to said error signal which controls said laser frequency at said desired laser frequency.

2. The system as in claim 1, wherein said laser includes a diode laser, a fiber laser, or a distributed feedback laser.

3. The system as in claim 1, further comprising an optical isolator located in an optical path between said laser and said optical coupler to mitigate optical feedback to said laser.

4. The system as in claim 1, wherein said polarization unit includes a quarter-wave plate positioned in an optical path between said optical coupler and said resonator.

5. The system as in claim 1, wherein said polarization unit includes a half-wave plate positioned in an optical path between said optical coupler and said optical polarizer.

6. The system as in claim 1, wherein said resonator is formed in an optical fiber.

7. The system as in claim 1, wherein said resonator includes two reflectors and a birefringent medium located in an optical path between said two reflectors.

8. The system as in claim 1, further comprising a fiber to receive and guide said laser beam, and wherein said optical coupler is a fiber coupler.

9. The system as in claim 1, wherein said laser beam is directed to said optical coupler via free space, and wherein said optical coupler is a beam splitter.

10. A system, comprising:
    a laser configured to produce a laser beam at a laser frequency with a linear polarization;
    an optical coupler positioned to receive a portion of said laser beam and operable to split said received portion into a monitor beam and a first optical signal;
    an optical Fabry-Perot resonator configured to include a birefringent medium which exhibits different refractive indices along first and second orthogonal polarization axes, and positioned to reflect a portion of said monitor beam as a second optical signal and oriented so that said linear polarization of said monitor beam is not parallel to either of said first and said second polarization axes of said birefringent medium, wherein said resonator is configured to exhibit a cavity resonance to substantially transmit a first light beam in said monitor beam that is polarized in said first polarization axis and to substantially reflect a second light beam in said monitor beam that is polarized in said second polarization, and wherein said resonator is tunable to change said cavity resonance in response to a control signal;
    a polarization unit located in an optical path of at least a portion of said second optical signal from said resonator to produce a phase shift of about 90 degrees between polarizations along said first and said second polarization axes in said portion of said second optical signal;
    an optical polarizer having a polarization that is not parallel to either of said polarizations along said first and said second polarization axes in said second optical signal, positioned to receive at least part of said portion of said second optical signal to produce a third optical signal;
    a first optical detector positioned to receive said first optical signal to produce a first detector signal;
    a second optical detector positioned to receive said third optical signal to produce a second detector signal;
    a signal subtracting circuit coupled to said first and said second optical detectors to mix said first and said second detector signals to produce an error signal that indicates a frequency difference between said laser frequency from said resonance of said resonator; and
    a resonator control unit coupled to receive said error signal and operable to produce said control signal according to said error signal.

11. A system for monitoring a frequency of a laser, comprising:
    an optical resonator having a birefringent medium located at least in part of an optical path within said resonator, said resonator positioned to receive a laser beam produced by the laser to reflect a portion of the laser beam as a reflected optical signal and oriented so that said linear polarization of the laser beam is not parallel to either of two principal polarization axes of said birefringent medium;

an optical element located in an optical path of at least a portion of said reflected optical signal from said resonator to produce a phase shift of about 90 degrees between polarizations respectively along said two principal polarization axes;

an optical polarizer located in an optical path of at least a portion of a transmitted signal from said optical element to mix two orthogonal polarizations to produce a mixed optical signal; and an optical detector positioned to receive said mixed optical signal to produce a detector signal which has an AC component indicating a frequency difference between the laser frequency and a resonance of said resonator.

12. The system as in claim 11, further comprising:

a second optical detector to receive a fraction of the laser beam from the laser to produce a second detector signal; and a signal subtracting circuit coupled to said optical detector and said second optical detector to subtract said second detector signal from said detector signal to produce an error signal which mainly contains said AC component.

13. The system as in claim 11, wherein said two principal polarization axes of said birefringent medium are substantially perpendicular to an optic axis of said resonator.

14. The system as in claim 11, further comprising a fiber that receives and directs the laser beam.

15. A system, comprising:

a laser to produce a laser beam of a linear polarization at a laser frequency and tunable to vary said laser frequency according to a change in a laser parameter;

an optical resonator having a birefringent medium located at least in part of an optical path within said resonator, and positioned to receive said laser beam to reflect a portion of said laser beam as a reflected optical signal with said linear polarization of the laser beam being not parallel to either of two principal polarization axes of said birefringent medium;

an optical element located in an optical path of at least a portion of said reflected optical signal from said resonator to produce a phase shift of about 90 degrees between polarizations respectively along said two principal polarization axes;

an optical polarizer located in an optical path of at least a portion of a transmitted signal from said optical element to mix two orthogonal polarizations to produce a mixed optical signal;

an optical detector positioned to receive said mixed optical signal to produce a detector signal which has an AC component indicating a frequency change in the laser frequency; and a laser control unit coupled to control said laser parameter to set said laser frequency at a desired value in response to said AC component.

16. The system as in claim 15, wherein said resonator has two reflectors and wherein said birefringent medium is located at least in part of an optical path between said two reflectors.

17. The system as in claim 15, further comprising:

a second optical detector to receive a fraction of said laser beam from said laser to produce a second detector signal; and a signal subtracting circuit coupled to said optical detector and said second optical detector to subtract said second detector signal from said detector signal to produce an error signal which mainly contains said AC component.

18. A method, comprising:

directing a laser beam from a laser into a birefringent resonator have a birefringent medium with two orthogonal principal polarization axes, wherein the polarization of the laser beam is not parallel to a principal polarization axis of the birefringent medium;

causing a phase shift of about 90 degrees between two orthogonal polarizations in reflected light from the resonator by reflection of the laser beam;

using a polarizer to mix two orthogonal polarizations in the phase-shifted signal to produce a new optical signal;

converting the new optical signal into an electrical signal; and extracting a portion of the electrical signal to indicate a difference between a frequency of the laser and a resonance frequency of the resonator.

19. The method as in claim 18, wherein the extraction includes reducing a DC portion of the electrical signal.

20. The method as in claim 19 wherein the DC portion is reduced by adjusting a direction of the polarizer in producing the new optical signal.

21. The method as in claim 19, further comprising converting a fraction of the laser beam into a second electrical signal, and subtracting the second electrical signal from the electrical signal to reduce the DC portion.

22. The method as in claim 18, further comprising adjusting the laser to reduce the difference in frequency to lock the laser frequency to the resonator.

23. The method as in claim 18, wherein the resonator is tunable to change its resonance frequency in response to a control signal, the method further comprising tuning the resonator to reduce the difference in frequency to lock the resonator to the laser.

* * * * *